(12) United States Patent
Mutou et al.

(10) Patent No.: US 11,978,959 B2
(45) Date of Patent: May 7, 2024

(54) λ/4 TYPE RADIO WAVE ABSORBER

(71) Applicant: SEKISUI CHEMICAL CO., LTD., Osaka (JP)

(72) Inventors: Katsunori Mutou, Aichi (JP); Sachiko Nakao, Aichi (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 528 days.

(21) Appl. No.: 17/277,454

(22) PCT Filed: Sep. 25, 2019

(86) PCT No.: PCT/JP2019/037569
§ 371 (c)(1),
(2) Date: Mar. 18, 2021

(87) PCT Pub. No.: WO2020/067145
PCT Pub. Date: Apr. 2, 2020

(65) Prior Publication Data
US 2021/0265738 A1   Aug. 26, 2021

(30) Foreign Application Priority Data

Sep. 25, 2018   (JP) ................................ 2018-179480

(51) Int. Cl.
*H01Q 17/00* (2006.01)
*B32B 7/12* (2006.01)
(Continued)

(52) U.S. Cl.
CPC ............... *H01Q 17/00* (2013.01); *B32B 7/12* (2013.01); *B32B 15/09* (2013.01); *B32B 15/20* (2013.01);
(Continued)

(58) Field of Classification Search
CPC ..... B32B 15/043; B32B 15/046; B32B 15/06; B32B 15/08; B32B 15/082; B32B 15/085;
(Continued)

(56) References Cited

U.S. PATENT DOCUMENTS

| 2011/0180732 A1 | 7/2011 | Hirasawa et al. | |
| 2012/0225269 A1* | 9/2012 | Bedjukh | H05K 9/0088 |
| | | | 428/411.1 |

(Continued)

FOREIGN PATENT DOCUMENTS

| EP | 3 267 775 | 1/2018 |
| JP | 5-114813 | 5/1993 |

(Continued)

OTHER PUBLICATIONS

International Search Report dated Dec. 10, 2019 in International (PCT) Application No. PCT/JP2019/037569.
(Continued)

*Primary Examiner* — Timothy X Pham
(74) *Attorney, Agent, or Firm* — Wenderoth, Lind & Ponack, L.L.P.

(57) ABSTRACT

An object is to provide a λ/4 radio wave absorber that includes a support, a resistive film, a dielectric layer, and a reflective layer, and that has higher radio wave absorption performance. The object is achieved by a λ/4 radio wave absorber that includes a support, a resistive film, a dielectric layer, and a reflective layer, and that satisfies formula (1): $-0.375x+1086.9 < y < -0.375x+1140$ wherein x represents a resistance value of the resistive film, and y=the thickness of the support×(the relative permittivity of the support)$^{0.5}$+the thickness of the dielectric layer×(the relative permittivity of the dielectric layer)$^{0.5}$.

11 Claims, 2 Drawing Sheets

(51) Int. Cl.
| | |
|---|---|
| *B32B 15/09* | (2006.01) |
| *B32B 15/20* | (2006.01) |
| *B32B 27/20* | (2006.01) |
| *B32B 27/36* | (2006.01) |
| *C23C 14/20* | (2006.01) |
| *C23C 14/34* | (2006.01) |

(52) U.S. Cl.
CPC ............ *B32B 27/20* (2013.01); *B32B 27/365* (2013.01); *C23C 14/205* (2013.01); *C23C 14/34* (2013.01); *B32B 2255/10* (2013.01); *B32B 2255/205* (2013.01); *B32B 2264/1022* (2020.08); *B32B 2307/204* (2013.01); *B32B 2307/416* (2013.01)

(58) Field of Classification Search
CPC ..... B32B 15/088; B32B 15/09; B32B 15/092; B32B 15/095; B32B 15/18; B32B 15/20; B32B 2255/10; B32B 2255/20; B32B 2255/205; B32B 2255/28; B32B 2264/10; B32B 2264/102; B32B 2264/1022; B32B 2264/107; B32B 2270/00; B32B 23/04; B32B 23/048; B32B 23/08; B32B 2307/204; B32B 2307/30; B32B 2307/416; B32B 2307/538; B32B 2307/712; B32B 2307/732; B32B 2457/00; B32B 25/042; B32B 25/045; B32B 25/08; B32B 25/14; B32B 25/16; B32B 25/18; B32B 25/20; B32B 27/065; B32B 27/08; B32B 27/18; B32B 27/20; B32B 27/281; B32B 27/283; B32B 27/285; B32B 27/286; B32B 27/288; B32B 27/30; B32B 27/302; B32B 27/304; B32B 27/306; B32B 27/308; B32B 27/32; B32B 27/325; B32B 27/34; B32B 27/36; B32B 27/365; B32B 27/38; B32B 27/40; B32B 5/18; B32B 5/32; B32B 7/12; C23C 14/205; C23C 14/34; H01Q 17/00; H05K 9/0084; H05K 9/0088
See application file for complete search history.

(56) References Cited

U.S. PATENT DOCUMENTS

| | | | |
|---|---|---|---|
| 2018/0177083 A1 | 6/2018 | Kammuri et al. | |
| 2019/0373778 A1 | 12/2019 | Toyoda | |
| 2019/0380232 A1 | 12/2019 | Machinaga et al. | |
| 2020/0128705 A1* | 4/2020 | Yamagata | B32B 25/18 |
| 2020/0146191 A1 | 5/2020 | Toyoda et al. | |
| 2020/0161771 A1 | 5/2020 | Ukei et al. | |
| 2020/0178426 A1* | 6/2020 | Ui | H05K 9/0084 |
| 2020/0207059 A1 | 7/2020 | Yamagata et al. | |
| 2020/0214181 A1 | 7/2020 | Yamagata et al. | |
| 2021/0059085 A1* | 2/2021 | Yamagata | B32B 15/09 |

FOREIGN PATENT DOCUMENTS

| | | |
|---|---|---|
| JP | 2017-5214 | 1/2017 |
| JP | 2017-114935 | 6/2017 |
| JP | 2017-163141 | 9/2017 |
| JP | 2018-56562 | 4/2018 |
| JP | 2018-98367 | 6/2018 |
| JP | 2018-117073 | 7/2018 |
| JP | 2018-147999 | 9/2018 |
| JP | 2019-4002 | 1/2019 |
| JP | 2019-4003 | 1/2019 |
| JP | 2019-4004 | 1/2019 |
| JP | 2019-4005 | 1/2019 |
| WO | 2010/016238 | 2/2010 |
| WO | 2018/088492 | 5/2018 |
| WO | 2018/163584 | 9/2018 |

OTHER PUBLICATIONS

Notification of Reasons for Refusal dated May 19, 2020 in corresponding Japanese Application No. 2020-504418, with English translation.

Kondo, A. et al., "A λ/4 Wave Absorber for Both 60 and 76 GHz Bands", The Institute of Electrical Engineers of Japan, IEEJ Trans. EIS, vol. 124, No. 2, 2004, pp. 335-340, with partial English translation.

Osamu, H. et al., "Realization of the Resistive Sheet Type Wave Absorber at 94 GHz Frequency Band", Journal of Institute of Electrical Engineers of Japan, T. JEE Japan, vol. 117-A, No. 6, 1997, pp. 632-637, with partial English translation.

Professor Kenji Saegusa, Presentation material for the 21st EMC Environmental Forum, Nihon University, Oct. 21, 2015, with partial English translation.

Chishiki no Mori [Forest of Knowledge], Institute of Electronics, Information and Communication Engineers, Group 9—Part 1—Chapter 1, 2013, pp. 12/(55)-13/(55), with partial English translation.

Teresa Bonfig et al., Estimation of the relative permittivity from the molecular structure of polymers used in automotive industries, Material Research Express, vol. 7 (2020) 125301, 13 pages total.

Partial Supplementary European Search Report dated May 17, 2022 in corresponding European Patent Application No. 19867141.4.

* cited by examiner

λ/4 TYPE RADIO WAVE ABSORBER

TECHNICAL FIELD

The present invention relates to a λ/4 radio wave absorber and a relevant item.

BACKGROUND ART

Mobile communication devices such as cellular phones and smartphones have rapidly become widespread. Automobiles, for example, have been equipped with many electronic devices. However, due to radio waves and noise generated from these devices, radio disturbances or malfunctions of other electronic devices frequently occur. To prevent these problems such as radio disturbances and malfunctions, various radio wave absorbers have been studied. For example, PTL 1 discloses an electromagnetic wave absorber that has a bandwidth of 2 GHz or more in a frequency band of which the absorption of electromagnetic waves is 20 dB or more within the frequency band of 60 to 90 GHz.

CITATION LIST

Patent Literature

PTL 1: JP2018-098367A

SUMMARY OF INVENTION

Technical Problem

In increasing the absorption performance of λ/4 radio wave absorbers, it has been considered important to bring the resistance value of the resistive film to 377Ω and the thickness of the dielectric layer to a specific value. However, the present inventors found during the course of research that an absorber that includes a support in its structure may lose absorption performance when assembled; i.e., sufficient absorption performance cannot be achieved only by considering the thickness of the dielectric layer and the resistance value of the resistive film.

Thus, an object of the present invention is to provide a λ/4 radio wave absorber that includes a support, a resistive film, a dielectric layer, and a reflective layer, and that has higher radio wave absorption performance.

Solution to Problem

The present inventors found during the course of research that the thickness of the support and the relative permittivity also affect absorption characteristics. They continued research based on these findings and found that the suitable range of resistance values of the resistive film varies depending on the relative permittivity and thickness of the support and the relative permittivity and distance between the resistive film and the reflective layer.

As a result of extensive research based on these findings, the present inventors found that the object can be achieved by a λ/4 radio wave absorber that includes a support, a resistive film, a dielectric layer, and a reflective layer, and that satisfies formula (1): $-0.375x+1086.9 < y < -0.375x+1140$ wherein x represents a resistance value of the resistive film, and y=the thickness of the support×(the relative permittivity of the support)$^{0.5}$+the thickness of the dielectric layer×(the relative permittivity of the dielectric layer)$^{0.5}$.

The inventors conducted further research based on this finding and then completed the present invention.

Specifically, the present invention includes the following embodiments.

Item 1.

A λ/4 radio wave absorber comprising
a support,
a resistive film,
a dielectric layer, and
a reflective layer,
the λ/4 radio wave absorber satisfying the following formula (1):

$$-0.375x+1086.9 < y < -0.375x+1140$$

wherein x represents a resistance value of the resistive film, and y=a thickness of the support×(a relative permittivity of the support)$^{0.5}$+a thickness of the dielectric layer×(a relative permittivity of the dielectric layer)$^{0.5}$.

Item 2.

The λ/4 radio wave absorber according to Item 1, wherein the resistive film has a resistance value of 200Ω/□ or more and 500Ω/□ or less.

Item 3.

The λ/4 radio wave absorber according to Item 1 or 2, wherein the dielectric layer has a relative permittivity of 1 or more and 10 or less.

Item 4.

The λ/4 radio wave absorber according to any one of Items 1 to 3, wherein the support has a thickness of 15 μm or more and 200 μm or less.

Item 5.

The λ/4 radio wave absorber according to any one of Items 1 to 4, wherein the support has a relative permittivity of 1 or more and 10 or less.

Item 6.

The λ/4 radio wave absorber according to any one of Items 1 to 5, wherein the resistive film contains molybdenum.

Item 7.

The λ/4 radio wave absorber according to Item 6, wherein the resistive film further contains nickel and chromium.

Item 8.

The λ/4 radio wave absorber according to any one of Items 1 to 7, wherein the dielectric layer contains an adhesive layer.

Item 9.

The λ/4 radio wave absorber according to any one of Items 1 to 8, further comprising a barrier layer on at least one surface of the resistive film.

Item 10.

The λ/4 radio wave absorber according to any one of Items 1 to 9, wherein the surface of the reflective layer facing the dielectric layer has a surface roughness (Rz) of 1 μm or more and 10 μm or less.

Item 11.

A λ/4 radio wave absorber member comprising
a support,
a resistive film, and
a dielectric layer,
the λ/4 radio wave absorber member satisfying the following formula (1):

$$-0.375x+1086.9 < y < -0.375x+1140$$

wherein x represents a resistance value of the resistive film, and y=a thickness of the support×(a relative permittivity of the support)$^{0.5}$+a thickness of the dielectric layer×(a relative permittivity of the dielectric layer)$^{0.5}$.

Advantageous Effects of Invention

The present invention provides a λ/4 radio wave absorber that includes a support, a resistive film, a dielectric layer, and a reflective layer, and that has higher radio wave absorption performance.

BRIEF DESCRIPTION OF DRAWINGS

FIG. 3 illustrates on the lower side the schematic cross section of an adherend that is arranged such that the radio wave absorber member comes in contact with the adherend, and that functions as a reflective layer in an embodiment of the invention.

DESCRIPTION OF EMBODIMENTS

Figure 1:
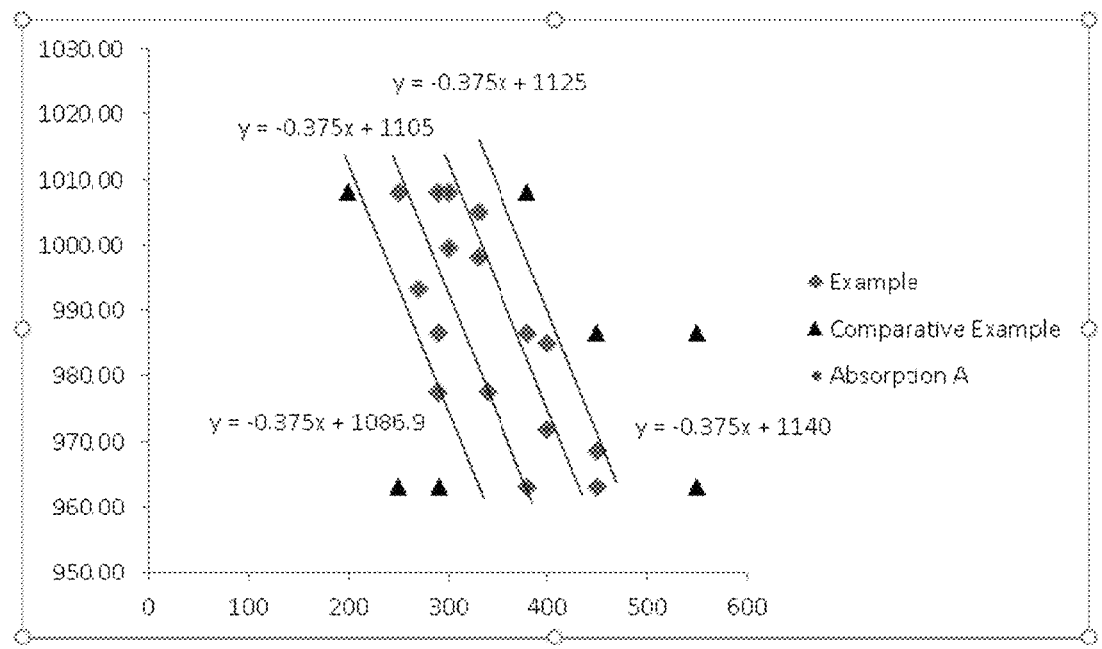
FIG. 1 illustrates the evaluation results of radio wave absorption. The vertical axis indicates the value of y in formula (1), and the horizontal axis indicates the value of x in formula (1).
Figure 2:
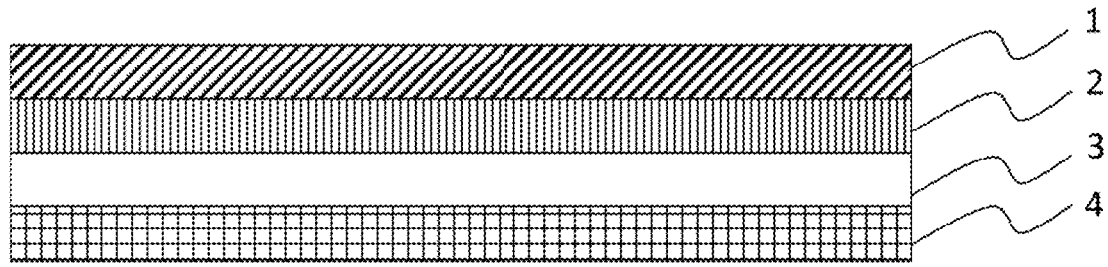
FIG. 2 illustrates the schematic cross section of the radio wave absorber according to an embodiment of the present invention.
Figure 3:
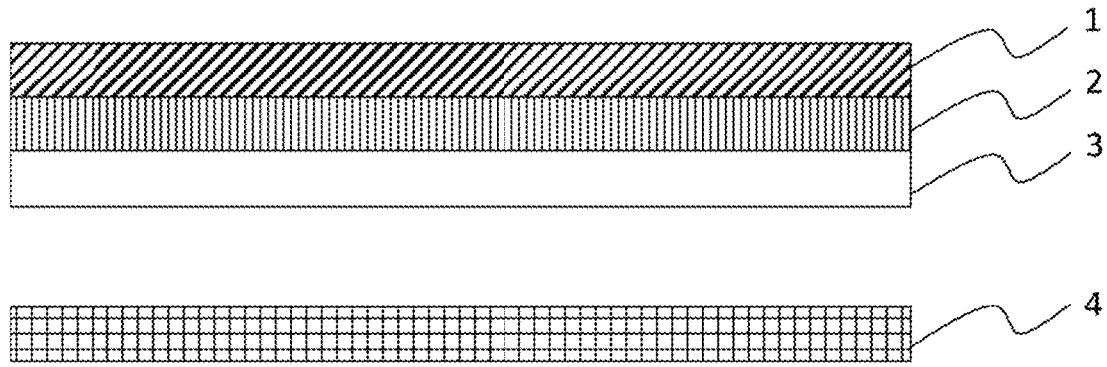
FIG. 3 illustrates on the upper side the schematic cross section of the radio wave absorber member according to an embodiment of the present invention.
Figure 4:
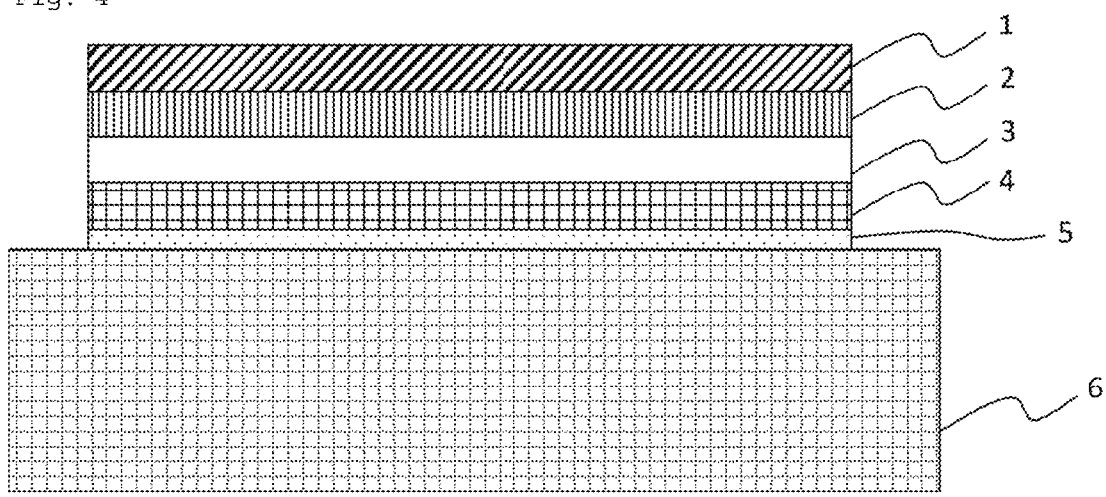
FIG. 4 illustrates a schematic cross section that illustrates an application of the radio wave absorber according to an embodiment of the present invention. (In this embodiment, the radio wave absorber is disposed on a chassis through an adhesive.)

In the present specification, the terms "comprise," "contain," and "include" includes the concepts of comprising, containing, including, consisting essentially of, and consisting of.

The present invention according to an embodiment relates to a λ/4 radio wave absorber that includes a support, a resistive film, a dielectric layer, and a reflective layer, and that satisfies formula (1): $-0.375x+1086.9<y<-0.375x+1140$ wherein x represents the resistance value of the resistive film, and y=the thickness of the support×(the relative permittivity of the support)$^{0.5}$+the thickness of the dielectric layer×(the relative permittivity of the dielectric layer)$^{0.5}$ (also "the radio wave absorber according to the present invention" in the present specification). The radio wave absorber according to the present invention is described below.

1. Support

The support can be any material in sheet form. Examples of supports include, but are not limited to, resin base materials. The support protects the resistive film and increases the durability of the radio wave absorber.

The resin base material refers to a base material that contains resin as a material, and can be any resin material in sheet form. The resin base material may contain components other than resin to the extent that the effect of the present invention is not significantly impaired. For example, from the standpoint of adjusting relative permittivity, the resin base material may contain titanium oxide. In this case, the total content of resin in the resin base material is, for example, 80 mass % or more, preferably 90 mass % or more, more preferably 95 mass % or more, and still more preferably 99 mass % or more, and typically less than 100 mass %.

Examples of resins include, but are not limited to, polyester-based resins, such as polyethylene terephthalate (PET), polyethylene naphthalate, and modified polyester; polyolefin resins, such as polyethylene (PE) resin, polypropylene (PP) resin, polystyrene resin, and cyclic olefin-based resins; vinyl-based resins, such as polyvinyl chloride and polyvinylidene chloride; polyvinyl acetal resins, such as polyvinyl butyral (PVB); polyether ether ketone (PEEK) resin, polysulfone (PSF) resin, polyether sulfone (PES) resin, polycarbonate (PC) resin, polyamide resin, polyimide resin, acrylic resin, and triacetyl cellulose (TAO) resin. These resins can be used singly or in a combination of two or more.

Of these, from the standpoint of productivity and strength, polyester-based resins are preferable, and polyethylene terephthalate is more preferable.

The relative permittivity of the support can be any value that satisfies formula (1), described below. The relative permittivity of the support is, for example, 1 or more and 20 or less, preferably 1 or more and 15 or less, and more preferably 1 or more and 10 or less.

For the purpose of adjusting the relative permittivity of the support such that the λ/4 radio wave absorber satisfies formula (1), described below, it is preferable to add to the support additives such as titanium oxide, silica, barium titanate, ulmin, and zirconium oxide. From the standpoint of weatherability, titanium oxide is preferable.

The content of the additives in the support is not particularly limited, and is preferably 8 wt % or more and 20 wt % or less, and more preferably 9 wt % or more and 15 wt % or less. From the standpoint of strength, the content of the additives is preferably 20% or less; from the standpoint of weatherability, the content of the additives is preferably 8% or more.

The thickness of the support can be any value that can satisfy formula (1), described below. The thickness of the support is, for example, 5 μm or more and 500 μm or less, preferably 10 μm or more and 300 μm or less, and more preferably 20 μm or more and 300 μm or less.

The layer structure of the support is not particularly limited. The support may be composed of a single support or a combination of two or more supports.

2. Resistive Film

The resistive film can be any resistive film that functions as a resistive layer in radio wave absorbers.

2-1. ITO-Containing Resistive Film

The resistive film for use is, for example, indium tin oxide ("ITO" below). In particular, a resistive film containing ITO that contains 20 to 40 wt %, more preferably 25 to 35 wt % of $SnO_2$ (e.g., 50 mass % or more, preferably 70 mass % or more, more preferably 90 mass % or more, and still more preferably 95 mass % or more, and typically less than 100 mass: in the resistive film) is preferable for use from the standpoint of the highly stable amorphous structure and suppressed changes in sheet resistance of the resistive film in hot and humid conditions.

2-2. Molybdenum-Containing Resistive Film

The resistive film for use preferably contains molybdenum from the standpoint of durability and the ease of adjusting resistivity. The lower limit of the content of molybdenum is not particularly limited; from the standpoint of increasing durability, the lower limit of the content of molybdenum is preferably 5 wt %, more preferably 7 wt %, still more preferably 9 wt %, yet more preferably 11 wt %, particularly preferably 13 wt, very preferably 15 wt %, and most preferably 16 wt %. The upper limit of the content of molybdenum is preferably 30 wt %, more preferably 25 wt %, and still more preferably 20 wt % from the standpoint of the ease of adjusting the value of surface resistance.

More preferably, the resistive film that contains molybdenum further contains nickel and chromium. A resistive film containing nickel and chromium in addition to molybdenum leads to a λ/4 radio wave absorber with excellent durability. Examples of alloy containing nickel, chromium, and molybdenum include a variety of alloy grades such as Hastelloy B-2, B-3, C-4, C-2000, C-22, C-276, G-30, N, W, and X.

The resistive film containing molybdenum, nickel, and chromium preferably contains molybdenum in an amount of 5 wt % or more, nickel in an amount of 40 wt % or more, and chromium in an amount of 1 wt % or more. The resistive film containing molybdenum, nickel, and chromium in amounts within these ranges leads to a λ/4 radio wave absorber with further improved durability. The resistive film more preferably contains molybdenum in an amount of 7 wt % or more, nickel in an amount of 45 wt % or more, and chromium in an amount of 3 wt % or more. The resistive film still more preferably contains molybdenum in an amount of 9 wt % or more, nickel in an amount of 47 wt % or more, and chromium in an amount of 5 wt % or more. The resistive film yet more preferably contains molybdenum in an amount of 11 wt % or more, nickel in an amount of 50 wt % or more, and chromium in an amount of 10 wt % or more. The resistive film particularly preferably contains molybdenum in an amount of 13 wt % or more, nickel in an amount of 53 wt % or more, and chromium in an amount of 12 wt % or more. The resistive film very preferably contains molybdenum in an amount of 15 wt % or more, nickel in an amount of 55 wt % or more, and chromium in an amount of 15 wt % or more. The resistive film most preferably contains molybdenum in an amount of 16 wt % or more, nickel in an amount of 57 wt % or more, and chromium in an amount of 16 wt % or more. Additionally, the nickel content in the resistive film is preferably 80 wt % or less, more preferably 70 wt % or less, and still more preferably 65 wt % or less. The upper limit of the chromium content is preferably 50 wt % or less, more preferably 40 wt % or less, and still more preferably 35 wt % or less.

The resistive film may further contain metals other than molybdenum, nickel, or chromium. Examples of such metals include iron, cobalt, tungsten, manganese, and titanium. The upper limit of the total content of metals other than molybdenum, nickel, and chromium in the resistive film containing molybdenum, nickel, and chromium is preferably 45 wt %, more preferably 40 wt %, still more preferably 35 wt %, yet more preferably 30 wt %, particularly preferably 25 wt %, and very preferably 23 wt % from the standpoint of durability of the resistive film. The lower limit of the total content of metals other than molybdenum, nickel, and chromium is, for example, 1 wt % or more.

When the resistive film contains iron, the upper limit of the content of iron is preferably 25 wt %, more preferably 20 wt %, and still more preferably 15 wt %, with the lower limit being preferably 1 wt % from the standpoint of durability of the resistive film. When the resistive film contains cobalt and/or manganese, the upper limit of the content of each metal is independently preferably 5 wt %, more preferably 4 wt %, and still more preferably 3 wt %, with the lower limit being preferably 0.1 wt % from the standpoint of durability of the resistive film. When the resistive film contains tungsten, the upper limit of the content of tungsten is preferably 8 wt %, more preferably 6 wt %, and still more preferably 4 wt %, with the lower limit being preferably 1 wt % from the standpoint of durability of the resistive film.

The resistive film may contain silicon and/or carbon. The resistive film containing silicon and/or carbon contains silicon and/or carbon in an individual amount of preferably 1 wt % or less, and more preferably 0.5 wt % or less.

The resistive film containing silicon and/or carbon contains silicon and/or carbon in an individual amount of preferably 0.01 wt % or more.

The resistance value of the resistive film can be any value that satisfies formula (1), described below. The resistance value of the resistive film is, for example, 100Ω/☐ or more and Ω/☐ or less, preferably 150Ω/☐ or more and 1000Ω/☐ or less, more preferably 200Ω/☐ or more and 600Ω/☐ or less, and still more preferably 250Ω/☐ or more and 450Ω/☐ or less.

The thickness of the resistive film can be any thickness that gives a resistance value that satisfies formula (1), described below. The thickness of the resistive film is, for example, 1 nm or more and 200 nm or less, preferably 2 nm or more and 100 nm or less, and more preferably 2 nm or more and 50 nm or less.

The layer structure of the resistive film is not particularly limited. The resistive film may be composed of a single resistive film or a combination of two or more resistive films.

3. Dielectric Layer

The dielectric layer can be any dielectric layer that can function as a dielectric for a target wavelength in a radio wave absorber. Examples of dielectric layers include, but are not limited to, resin sheets and adhesives.

The resin sheet can be any resin in sheet form that contains resin as a material. The resin sheet may contain components other than resin to the extent that the effect of the present invention is not significantly impaired. In this case, the total content of resin in the resin sheet is, for example, 50 mass % or more, preferably 70 mass % or more, more preferably 90 mass % or more, and still more preferably 95 mass % or more, and typically less than 100 mass %.

The resin can be any resin, and the resin for use as a resin component is, for example, preferably a synthetic resin, such as ethylene vinyl acetate copolymers (EVA), vinyl chloride, urethane, acrylic, acrylic urethane, polyolefin, polyethylene, polypropylene, silicone, polyethylene terephthalate, polyester, polystyrene, polyimide, polycarbonate, polyamide, polysulfone, polyethersulfone, and epoxy; and a synthetic rubber material, such as polyisoprene rubber, polystyrene-butadiene rubber, polybutadiene rubber, chloroprene rubber, acrylonitrile-butadiene rubber, butyl rubber, acrylic rubber, ethylene-propylene rubber, and silicone rubber. These resins can be used singly or in a combination of two or more.

The dielectric layer may be a resin sheet, foam, or adhesive. From the standpoint of precision of the thickness of the dielectric layer, the dielectric layer is preferably a resin sheet or an adhesive.

The dielectric layer may have adhesiveness. Thus, when a dielectric with no adhesiveness is stacked on another layer through an adhesive layer, the combination of the dielectric and the adhesive layer forms a dielectric layer. From the standpoint of the ease of stacking a dielectric layer on an adjacent layer, the dielectric layer preferably contains an adhesive layer.

The relative permittivity of the dielectric layer can be any value that satisfies formula (1), described below. The relative permittivity of the dielectric layer is, for example, 1 or more and 20 or less, preferably 1 or more and 15 or less, and more preferably 1 or more and 10 or less.

The thickness of the dielectric layer can be any thickness that satisfies formula (1), described below. The thickness of the dielectric layer is, for example, 10 μm or more and 2000 μm or less, preferably 100 μm or more and 1500 μm or less, and more preferably 200 μm or more and 800 μm or less.

The layer structure of the dielectric layer is not particularly limited. The dielectric layer may be composed of a single dielectric layer or a combination of two or more dielectric layers. Examples include a dielectric layer with a three-layered structure that includes a non-adhesive dielectric and an adhesive layer disposed on each surface of the non-adhesive dielectric, and a dielectric layer with a monolayer structure that includes an adhesive dielectric.

4. Reflective Layer

The reflective layer can be any layer that functions as a reflective layer for radio waves in a radio wave absorber. Examples of reflective layers include, but are not limited to, metal films.

The metal film can be any metal film that contains metal as a material. The metal film may contain components other than metal to the extent that the effect of the present invention is not significantly impaired. In this case, the total content of metal in the metal film is, for example 30 mass % or more, preferably 50 mass % or more, more preferably 75 mass % or more, still more preferably 80 mass % or more, yet more preferably 90 mass % or more, particularly preferably 95 mass % or more, and very preferably 99 mass % or more, and typically less than 100 mass %.

The metal can be any metal. Examples of metals include aluminum, copper, iron, silver, gold, chromium, nickel, molybdenum, gallium, zinc, tin, niobium, and indium. Metal compounds, such as ITO, are also usable as a material of metal films. These metals can be used singly or in a combination of two or more.

The thickness of the reflective layer is not particularly limited. The thickness of the reflective layer is, for example, 1 µm or more and 500 µm or less, preferably 2 µm or more and 200 µm or less, and more preferably 5 µm or more and 100 µm or less.

In a preferable embodiment of the present invention, the surface of the reflective layer facing the dielectric layer preferably has a surface roughness (Rz) of 1 µm or more and 10 µm or less. A surface roughness within this range enables the dielectric layer and the reflective layer to adhere well to each other and enables the λ/4 radio wave absorber to exhibit further improved radio wave absorption. The surface roughness (Rz) is preferably 1 µm or more and 8 µm or less, and more preferably 1 µm or more and 5 µm or less.

In a preferable embodiment of the present invention, the surface of the reflective layer not facing the dielectric layer has a surface roughness (Rz) of 1 µm or more. This enables the reflective layer to adhere well with a layer (e.g., an adhesive layer) stacked on the surface of the reflective layer not facing the dielectric layer, and makes it easier to attach the λ/4 radio wave absorber according to the present invention to another member (e.g., a device in an automobile). This surface roughness (Rz) is preferably 30 µm or less, and more preferably 2 µm or more and 15 µm or less.

The surface roughness (Rz) of the reflective layer can be measured as described below. The surface roughness (Rz) can be estimated by measuring the unevenness on the surface of the reflective layer with a color 3D laser scanning microscope (VK8710, produced by Keyence Corporation, or similar equipment). Specifically, Rz in an area of 10 µm×10 µm on the surface of a reflective layer is measured at 5 randomly selected points with a 50× objective lens in accordance with JIS B0601:2001, and the average is calculated to determine the surface roughness (Rz).

The surface roughness (Rz) of the reflective layer can be adjusted in accordance with or based on a known method for adjusting the surface roughness. For example, the surface roughness (Rz) of the reflective layer can be adjusted by adding fine metal particles by a metal plating technique or by scraping the surface by a physical or chemical technique.

The layer structure of the reflective layer is not particularly limited. The reflective layer may be composed of a single reflective layer or a combination of two or more reflective layers.

5. Layer Structure and Other Layer

The layers contained in the radio wave absorber according to the present invention are arranged in such an order as to enable the radio wave absorber to exhibit radio wave absorption performance. In an embodiment, the support, the resistive film, the dielectric layer, and the reflective layer are arranged in this order.

The radio wave absorber according to the present invention may contain another layer in addition to the support, the resistive film, the dielectric layer, and the reflective layer. Another layer may be stacked on one surface of the support, the resistive film, the dielectric layer, and/or the reflective layer.

From the standpoint of durability, the radio wave absorber according to the present invention preferably further contains a barrier layer on at least one surface of the resistive film. The barrier layer is described in detail below.

5-1. Barrier Layer

The barrier layer can be any layer that can protect the resistive film and that can suppress degradation of the resistive film. The material for the barrier layer can be, for example, a metal compound, and a metalloid compound, and preferably an oxide of a metal or metalloid, a nitride, and a nitride oxide. The barrier layer may contain components other than these materials to the extent that the effect of the present invention is not significantly impaired. In this case, the content of the material described above in the barrier layer is, for example, 80 mass % or more, preferably 90 mass % or more, more preferably 95 mass % or more, and still more preferably 99 mass % or more, and typically less than 100 mass %.

Examples of metals include titanium, aluminum, niobium, cobalt, and nickel. Examples of metalloids include silicon, germanium, antimony, and bismuth.

Examples of oxides of a metal or metalloid include compounds represented by $MO_X$ wherein X represents a number that satisfies the formula: $n/100 \leq X \leq n/2$ (n represents the valence of a metal), and M represents a metal element.

Examples of nitrides include compounds represented by $MN_y$ wherein Y represents a number that satisfies the formula: $n/100 \leq Y \leq n/3$ (n represents the valence of a metal), and M represents a metal element.

Examples of nitride oxides include compounds represented by $MO_xN_y$ wherein X and Y satisfy the following: $n/100 \leq X$, $n/100 \leq Y$, and $X+Y < n/2$ (n represents the valence of a metal), and M represents a metal element.

Regarding the oxidation number X of an oxide or nitride oxide, for example, elemental analysis of the cross-sectional surface of a layer containing $MO_x$ or $MO_xN_y$ is performed with an FE-TEM-EDX (e.g., JEM-ARM200F produced by JEOL Ltd.), and then X is calculated from the element ratio of M and O per area of the cross-sectional surface of the layer containing $MO_x$ or $MO_xN_y$. From this calculation, the valence of the oxygen atom can be determined.

Regarding the nitridation number Y of a nitride or nitride oxide, for example, elemental analysis of the cross-sectional surface of a layer containing $MN_y$ or $MO_xN_y$ is performed with an FE-TEM-EDX (e.g., JEM-ARM200F produced by JEOL Ltd.), and then Y is calculated from the element ratio of M and N per area of the cross-sectional surface of the layer containing $MN_y$ or $MO_xN_y$. From this calculation, the valence of the nitrogen atom can be determined.

Specific examples of materials of the barrier layer include $SiO_2$, $SiO_x$, $Al_2O_3$, $MgAl_2O_4$, CuO, CuN, $TiO_2$, TiN, and AZO (aluminum-doped zinc oxide).

The thickness of the barrier layer can be any thickness. The barrier layer has a thickness of, for example, 1 nm or more and 200 nm or less, preferably 1 nm or more and 100 nm or less, and more preferably 1 nm or more and 20 nm or less.

The layer structure of the barrier layer is not particularly limited. The barrier layer may be composed of a single barrier layer or a combination of two or more barrier layers.

6. Formula (1)

The radio wave absorber according to the present invention satisfies formula (1): $-0.375x+1086.9<y<-0.375x+1140$ wherein x represents the resistance value of the resistive film, and y=the thickness of the support×(the relative permittivity of the support)$^{0.5}$+the thickness of the dielectric layer×(the relative permittivity of the dielectric layer)$^{0.5}$. This enables the radio wave absorber to have higher radio wave absorption, while including the support, the resistive film, the dielectric layer, and the reflective layer.

In a preferable an embodiment, the radio wave absorber according to the present invention satisfies formula (1'): $-0.375x+1105<y<-0.375x+1125$ wherein x represents the resistance value of the resistive film, and y=the thickness of the support×(the relative permittivity of the support)$^{0.5}$+the thickness of the dielectric layer×(the relative permittivity of the dielectric layer)$^{0.5}$. This enables the radio wave absorber to have further increased radio wave absorption.

The resistance value of the resistive film can be measured by four-terminal sensing with a surface resistance tester (Loresta-EP, trade name, produced by Mitsubishi Chemical Analytech Co., Ltd.).

The thickness of the support and the thickness of the dielectric layer can be measured with an MS-11C measurement stand and a DIGIMICRO MFC-101 counter (Nikon Corporation).

The relative permittivity of the support and the relative permittivity of the dielectric layer can be determined by measuring relative permittivity at 10 GHz by the cavity perturbation method with, for example, a network analyzer or cavity resonator.

When the support and the dielectric layer are each composed of multiple layers, "the thickness of the support×(the relative permittivity of the support)$^{0.5}$" and "the thickness of the dielectric layer×(the relative permittivity of the dielectric layer)$^{0.5}$" are determined by calculating the thickness of each layer and totaling the values. For example, when the dielectric layer is composed of dielectric layer 1 and dielectric layer 2, the thickness of the dielectric layer×(the relative permittivity of the dielectric layer)$^{0.5}$ is determined by totaling the thickness of dielectric layer 1×(the relative permittivity of dielectric layer 1)$^{0.5}$ and the thickness of dielectric layer 2×(the relative permittivity of dielectric layer 2)$^{0.5}$.

The range of y in formula (1) is not particularly limited; y in formula (1) is preferably 800 or more and 1200 or less, more preferably 900 or more and 1100 or less, and still more preferably 964 or more and 1010 or less.

7. Production Method

The radio wave absorber according to the present invention can be obtained, for example, by a method including the step of sequentially stacking a resistive film, a dielectric layer, and a reflective layer on a support. Another method for obtaining the radio wave absorber includes the step of staking and forming a resistive film on one surface of a dielectric layer, the step of stacking a support on the surface of the resistive film not facing the dielectric layer, and the step of stacking a reflective layer on the surface of the dielectric layer not facing the resistive film.

The method for stacking layers can be any method.

The resistive film and the barrier layer can be stacked, for example, by sputtering, vacuum deposition, ion plating, chemical vapor deposition, or pulsed laser deposition. Of these, from the standpoint of film thickness controllability, sputtering is preferable. Sputtering can be of any type; examples include DC magnetron sputtering, high-frequency magnetron sputtering, and ion beam sputtering. The sputtering device may be of a batch system or roll-to-roll system.

The dielectric layer and the reflective layer can be stacked, for example, by using the adhesiveness of the dielectric layer.

8. λ/4 Radio Wave Absorber Member

In an embodiment, the present invention relates to a λ/4 radio wave absorber member that includes a support, a resistive film, and a dielectric layer, and that satisfies the following formula (1): $-0.375x+1086.9<y<-0.375x+1140$ wherein x represents the resistance value of the resistive film, and y=the thickness of the support×(the relative permittivity of the support)$^{0.5}$+the thickness of the dielectric layer×(the relative permittivity of the dielectric layer)$^{0.5}$.

The λ/4 radio wave absorber member is a member for forming a λ/4 radio wave absorber by arranging the dielectric layer so as to come in contact with an adherend that can function as a reflective layer such as metal. The support, the resistive film, the dielectric layer, the characteristics of the present invention, and other configurations are as explained for the λ/4 radio wave absorber according to the present invention.

9. Application

Due to its ability to absorb undesired electromagnetic waves, the radio wave absorber according to the present invention can be suitably used, for example, in an electromagnetic wave absorber for a millimeter-wave radar for use in automotive collision avoidance systems. Alternatively, the radio wave absorber according to the present invention can be used in order to reduce radio wave interference and noise in an intelligent transport system (ITS) that communicates between automobiles, roads, and people, and in the next-generation mobile communications system (5G), which uses millimeter waves.

The frequency of the radio wave targeted by the radio wave absorber according to the present invention is, for example, 20 GHz or more and 100 GHz or less, and preferably 50 GHz or more and 90 GHz or less.

EXAMPLES

The present invention is described in detail with reference to Examples below. However, the present invention is not limited to the Examples.

(1) Production of λ/4 Radio Wave Absorber

Example 1

A polyethylene terephthalate (PET) film (containing 10% of $TiO_2$ with a relative permittivity of 3.2) into which titanium oxide with a thickness of 25 μm was kneaded was prepared as a support. On this PET film, a resistive film with a thickness of 10 nm and a resistance value of 380Ω/□ was formed by pulsed DC sputtering. Sputtering was performed using an alloy (composition: molybdenum 16.4 wt %, nickel 55.2 wt %, chromium 18.9 wt %, iron 5.5 wt %, tungsten 3.5 wt %, and silica 0.5 wt %) as a target at an output of 0.4 kW by introducing Ar gas at a flow rate of 100 sccm to adjust the pressure to 0.12 Pa. Subsequently, a dielectric formed of polycarbonate with a thickness of 500 μm and a relative permittivity of 2.7 was stacked on the formed resistive film via adhesive tape (two-sided acrylic adhesive tape, thickness: 30 μm, relative permittivity: 2.6). Additionally, a reflective layer formed of aluminum with a thickness of 10 μm (surface roughness of the reflective layer facing the dielectric layer: Rz=3.2) was stacked on the dielectric via adhesive tape, thereby preparing a λ/4 radio wave absorber.

The thickness of the resistive film was determined by measuring the Cr content per unit area from the intensity of characteristic X-rays emitted when a surface of a metal thin film was irradiated with X rays using an X-ray fluorescence analyzer, and performing computation based on the compositional ratio of the target.

Examples 2 to 9 and Comparative Examples 1 to 8

λ/4 radio wave absorbers were prepared in the same manner as in Example 1, except that the relative permittivity of the support, the thickness of the support, the resistance value of the resistive film, the relative permittivity of the dielectric, the thickness of the dielectric, etc. were changed as shown in Tables 1 and 2.

Example 10

A λ/4 radio wave absorber was prepared in the same manner as in Example 1, except that the dielectric layer was changed to two-sided acrylic adhesive tape (thickness: 500 μm, relative permittivity: 2.4) with no base material, and that the relative permittivity of the support, the thickness of the support, the resistance value of the resistive film, etc. were changed as shown in Table 1. Specifically, the λ/4 radio wave absorber of Example 10 has a structure that includes a support, a resistive film, a dielectric layer (acrylic adhesive tape), and a reflective layer, in this order.

Examples 11 to 15

A λ/4 radio wave absorber was prepared in the same manner as in Example 10, except that the relative permittivity of the support, the thickness of the support, the resistance value of the resistive film, the relative permittivity of the dielectric, the thickness of the dielectric, etc. were changed as shown in Table 3.

Examples 16 to 20

λ/4 radio wave absorbers were prepared in the same manner as in Example 2, except that the surface roughness of the surface of each reflective layer was changed as shown in Table 4.

Example 21

A λ/4 radio wave absorber was prepared in the same manner as in Example 2, except that a polyethylene terephthalate (PET) film (containing 20% of $TiO_2$ with a relative permittivity of 3.4) into which titanium oxide with a thickness of 25 μm was kneaded was used as a support, and that the surface roughness of the surface of each reflective layer was changed as shown in Table 4.

The surface roughness Rz of the surface of each reflective layer was determined by measuring the unevenness of the surface of the reflective layers with a color 3D laser scanning microscope (VK8710, produced by Keyence Corporation). Measurement was performed at 5 randomly selected points on the surface of a reflective layer with a 50× objective lens; Rz in an area of 10 μm×10 μm was measured based on JISB0601:2001. The average of the values was determined to be Rz.

(2) Evaluation of Radio Wave Absorption A radio wave absorption measurement device was configured by using an N5227A PNA microwave network analyzer (produced by Keysight Technologies), an N5261A millimeter wave controller for PNA-X series 2-port (produced by Keysight Technologies), and a FSS-07 horn antenna (produced by HVS). The amount of radio wave absorption of the obtained λ/4 radio wave electromagnetic wave absorbers was measured in a K band (75 to 110 GHz) by using this radio wave absorption measurement device in accordance with JIS R1679. The λ/4 radio wave absorbers were set such that the radio wave incident direction was vertical, and that the radio waves entered from the support side. The electromagnetic wave absorption performance was evaluated based on the measured amount of absorption in accordance with the following evaluation criteria.

A: The amount of absorption is 30 dB or more.
B: The amount of absorption is less than 30 dB, but 20 dBdb or more.
C: The amount of absorption is less than 20 dB, but 15 dB or more.
D: The amount of absorption is less than 15 dB.

(3) Evaluation of Adhesion
(3-1) Evaluation of Adhesive Force (Between Dielectric Layer and Reflective Layer)

An obtained radio wave absorber was cut into 10-mm-wide strips to prepare a test specimen, and the surface of the dielectric layer not facing the reflective layer was exposed. The exposed surface was fixed onto the table of a measurement device with two-sided adhesive tape (9708, produced by The 3M Company). The reflective layer of this test sample was subjected to a tensile test at a peeling rate of 300 mm/min at an angle of 180° based on JIS Z0237, thereby measuring a 180-degree adhesive force (N/10 mm). An adhesive force between the dielectric layer and the reflective layer of 5 N/10 mm or more was rated as B, with less than 5 N/10 mm being rated C.

(3-2) Evaluation of Adhesive Force (Between Reflective Layer and Adhesive Layer)

An obtained radio wave absorber was cut into 10-mm-wide strips to prepare a test specimen, and the surface of the reflective layer facing to the dielectric was exposed. Subsequently, a 10-mm-wide strip of two-sided adhesive tape (9708, produced by The 3M Company) was adhered to the surface of the reflective layer not facing the dielectric. The sample was then fixed on the table of a measurement device via the other surface of the two-sided adhesive tape. This reflective layer was subjected to a tensile test at a peeling rate of 300 ram/min at an angle of 180° based on JIS Z0237, thereby measuring a 180-degree adhesive force (N/10 mm). An adhesive force of 5 N/10 mm or more was rated as B, with less than 5 N/10 mm being rated C.

Table 1 shows the results of Examples 1 to 10, and Table 2 shows the results of the Comparative Examples. Table 3 shows the results of Examples 11 to 15. Table 4 shows the results of Examples 16 to 21 together with the results of Example 2. FIG. 1 is a graph that illustrates the results of Tables 1 to 3. In Tables 1 to 4, the "Is formula 1 satisfied?" section indicates B when formula (1) is satisfied, and C when not satisfied: formula (1) $-0.375x+1086.9 < y < -0.375x+1137.5$ wherein x represents the resistance value of the resistive film, and y=the thickness of the support×(the relative permittivity of the support)$^{0.5}$+the thickness of the dielectric layer×(the relative permittivity of the dielectric layer)$^{0.5}$. When values are applied to formula (1), the adhesive tape was also considered to be a layer that constitutes the dielectric layer. In Tables 1 to 4, the unit of thickness is μm.

TABLE 1

| | | Example | | | | | | | | | |
|---|---|---|---|---|---|---|---|---|---|---|---|
| | | 1 | 2 | 3 | 4 | 5 | 6 | 7 | 8 | 9 | 10 |
| Configuration | Support: Relative Permittivity | 3.2 | 3.2 | 3.2 | 3.2 | 3.2 | 3.2 | 3.2 | 3.2 | 3.2 | 3.2 |
| | Support: Thickness (μm) | 25.0 | 125.0 | 188.0 | 25.0 | 130.0 | 130.0 | 188.0 | 188.0 | 125.0 | 125 |
| | Resistive Film: Resistance Ω/□ | 380 | 340 | 290 | 450.0 | 290.0 | 380 | 300.0 | 250.0 | 290.0 | 330 |
| | Tape: Thickness (μm) | 30.0 | 30.0 | 30.0 | 30.0 | 30.0 | 30.0 | 30.0 | 30.0 | 30.0 | — |
| | Tape: Relative Permittivity | 2.6 | 2.6 | 2.6 | 2.6 | 2.6 | 2.6 | 2.6 | 2.6 | 2.6 | — |
| | Dielectric: Relative Permittivity | 2.7 | 2.7 | 2.7 | 2.7 | 2.7 | 2.7 | 2.7 | 2.7 | 2.7 | 2.4 |
| | Dielectric: Thickness (μm) | 500.0 | 400.0 | 350.0 | 500.0 | 400.0 | 400.0 | 350.0 | 350.0 | 400.0 | 500 |
| | A: Support × (Permittivity)$^{0.5}$ | 44.72 | 223.61 | 336.30 | 44.72 | 232.55 | 232.55 | 336.30 | 336.30 | 223.61 | 223.61 |
| | B: Dielectric × (Permittivity)$^{0.5}$ | 918.33 | 754.01 | 671.86 | 918.33 | 754.01 | 754.01 | 671.86 | 671.86 | 754.01 | 774.60 |
| | y = A + B | 963.05 | 977.62 | 1008.16 | 963.05 | 986.57 | 986.57 | 1008.16 | 1008.16 | 977.62 | 998.20 |
| | Is formula 1 satisfied? | B | B | B | B | B | B | B | B | B | B |
| Evaluation | Radio Wave Absorption | A | A | A | B | B | B | A | B | B | A |

TABLE 2

| | | Comparative Example | | | | | | | |
|---|---|---|---|---|---|---|---|---|---|
| | | 1 | 2 | 3 | 4 | 5 | 6 | 7 | 8 |
| Configuration | Support: Relative Permittivity | 3.2 | 3.2 | 3.2 | 3.2 | 3.2 | 3.2 | 3.2 | 3.2 |
| | Support: Thickness (μm) | 188.0 | 25.0 | 25.0 | 3.2 | 130.0 | 130.0 | 25.0 | 188.0 |
| | Resistive Film: Resistance Ω/□ | 380.0 | 290.0 | 250.0 | 250.0 | 450.0 | 550.0 | 550.0 | 200.0 |
| | Tape: Thickness (μm) | 30.0 | 30.0 | 30.0 | 30.0 | 30.0 | 30.0 | 30.0 | 30.0 |
| | Tape: Relative Permittivity | 2.6 | 2.6 | 2.6 | 2.6 | 2.6 | 2.6 | 2.6 | 2.6 |
| | Dielectric: Relative Permittivity | 2.7 | 2.7 | 2.7 | 2.7 | 2.7 | 2.7 | 2.7 | 2.7 |
| | Dielectric: Thickness (μm) | 350.0 | 500.0 | 500.0 | 400 | 400.0 | 400.0 | 500.0 | 350.0 |
| | A: Support × (Permittivity)$^{0.5}$ | 336.30 | 44.72 | 44.72 | 5.72 | 232.55 | 232.55 | 44.72 | 336.30 |
| | B: Dielectric × (Permittivity)$^{0.5}$ | 671.86 | 918.33 | 918.33 | 754.01 | 754.01 | 754.01 | 918.33 | 671.86 |
| | y = A + B | 1008.16 | 963.05 | 963.05 | 759.74 | 986.57 | 986.57 | 963.05 | 1008.16 |
| | Is formula 1 satisfied? | C | C | C | C | C | C | C | C |
| Evaluation | Radio Wave Absorption | C | C | D | C | C | D | D | C |

TABLE 3

| | Example | 11 | 12 | 13 | 14 | 15 |
|---|---|---|---|---|---|---|
| Configuration | Support: Relative Permittivity | 3.2 | 3.2 | 3.2 | 3.2 | 3.2 |
| | Support: Thickness (μm) | 150 | 50 | 50 | 170 | 15 |
| | Resistive Film: Resistance Ω/□ | 270 | 400 | 450 | 300 | 400 |
| | Tape: Thickness (μm) | — | — | — | — | — |
| | Tape: Relative Permittivity | — | — | — | — | — |
| | Dielectric: Relative Permittivity | 2.4 | 2.7 | 2.7 | 2.7 | 2.7 |
| | Dielectric: Thickness (μm) | 468 | 545 | 535 | 424 | 575 |
| | A: Support × (Permittivity)$^{0.5}$ | 268.33 | 89.44 | 89.44 | 304.11 | 26.83 |
| | B: Dielectric × (Permittivity)$^{0.5}$ | 725.02 | 895.53 | 879.09 | 696.70 | 944.82 |
| | y = A + B | 993.35 | 984.97 | 968.54 | 1000.81 | 971.65 |
| | Is formula 1 satisfied? | B | B | B | B | B |
| Evaluation | Radio Wave Absorption | B | B | B | A | A |

TABLE 4

| | | Example | | | | | | |
|---|---|---|---|---|---|---|---|---|
| | | 2 | 16 | 17 | 18 | 19 | 20 | 21 |
| Config-uration | Support: Relative Permittivity | 3.2 | 3.2 | 3.2 | 3.2 | 3.2 | 3.2 | 3.4 |
| | Support: Thickness (μm) | 125.0 | 125.0 | 125.0 | 125.0 | 125.0 | 125.0 | 125 |
| | Resistive Film: Resistance Ω/□ | 340 | 340 | 340 | 340.0 | 340.0 | 340 | 330 |
| | Tape: Thickness (μm) | 30.0 | 30.0 | 30.0 | 30.0 | 30.0 | 30.0 | |
| | Tape: Relative Permittivity | 2.6 | 2.6 | 2.6 | 2.6 | 2.6 | 2.6 | |
| | Dielectric: Relative Permittivity | 2.7 | 2.7 | 2.7 | 2.7 | 2.7 | 2.7 | 2.4 |
| | Dielectric: Thickness (μm) | 400.0 | 400.0 | 400.0 | 400.0 | 400.0 | 400.0 | 500 |
| | A: Support × (Permittivity)$^{0.5}$ | 223.61 | 223.61 | 223.61 | 223.61 | 223.61 | 223.61 | 230.49 |
| | B: Dielectric × (Permittivity)$^{0.5}$ | 754.01 | 754.01 | 754.01 | 754.01 | 754.01 | 754.01 | 774.60 |
| | y = A + B | 977.62 | 977.62 | 977.62 | 977.62 | 977.62 | 977.62 | 1005.09 |
| | Is formula 1 satisfied? | B | B | B | B | B | B | B |
| | Surface Roughness of Reflective Layer Facing Dielectric Layer | 3.2 | 0.9 | 1.3 | 9.7 | 12 | 9.8 | 3.2 |
| | Surface Roughness of Reflective Layer Not Facing Dielectric Layer | 10.0 | 9.8 | 10.5 | 11.0 | 10.5 | 0.9 | 10 |
| Eval-uation | Radio Wave Absorption | A | A | A | A | B | B | B |
| | Adhesion (Dielectric/Reflective Layer) | B | C | B | B | B | B | B |
| | Adhesion (Reflective Layer/Chassis) | B | B | B | B | B | C | B |

DESCRIPTION OF THE REFERENCE NUMERALS 1 support
2 resistive film
3 dielectric layer
4 reflective layer
5 adhesive layer
6 chassis

The invention claimed is:

1. A λ/4 radio wave absorber comprising
a support,
a resistive film,
a dielectric layer, and
a reflective layer,
the λ/4 radio wave absorber satisfying the following formula (1):

$$-0.375x+1086.9 \leq y \leq -0.375x+1140$$

wherein x represents a resistance value of the resistive film, and
wherein y=a thickness of the support×(a relative permittivity of the support)$^{0.5}$+a thickness of the dielectric layer×(a relative permittivity of the dielectric layer)$^{0.5}$.

2. The λ/4 radio wave absorber according to claim 1, wherein the resistive film has a resistance value of 200Ω/□ or more and 500Ω/□ or less.

3. The λ/4 radio wave absorber according to claim 1, wherein the dielectric layer has a relative permittivity of 1 or more and 10 or less.

4. The λ/4 radio wave absorber according to claim 1, wherein the support has a thickness of 15 pin or more and 200 pin or less.

5. The λ/4 radio wave absorber according to claim 1, wherein the support has a relative permittivity of 1 or more and 10 or less.

6. The λ/4 radio wave absorber according to claim 1, wherein the resistive film contains molybdenum.

7. The λ/4 radio wave absorber according to claim 6, wherein the resistive film further contains nickel and chromium.

8. The λ/4 radio wave absorber according to claim 1, wherein the dielectric layer contains an adhesive layer.

9. The λ/4 radio wave absorber according to claim 1, further comprising a barrier layer on at least one surface of the resistive film.

10. The λ/4 radio wave absorber according to claim 1, wherein the surface of the reflective layer facing the dielectric layer has a surface roughness (Rz) of 1 μm or more and 10 μm or less.

11. A λ/4 radio wave absorber member comprising
a support,
a resistive film, and
a dielectric layer,
the λ/4 radio wave absorber member satisfying the following formula (1):

$$-0.375x+1086.9 \leq y \leq -0.375x+1140$$

wherein x represents a resistance value of the resistive film, and
wherein y=a thickness of the support×(a relative permittivity of the support)$^{0.5}$+a thickness of the dielectric layer×(a relative permittivity of the dielectric layer)$^{0.5}$.

* * * * *